United States Patent
Vangool et al.

(10) Patent No.: US 9,797,939 B2
(45) Date of Patent: Oct. 24, 2017

(54) NEUTRAL GROUNDING RESISTOR MONITOR

(71) Applicant: LITTELFUSE, INC., Chicago, IL (US)

(72) Inventors: Michael P. Vangool, Saskatoon (CA); Geoffrey J. Baker, Martensville (CA)

(73) Assignee: Littelfuse, Inc., Chicago, IL (US)

( * ) Notice: Subject to any disclaimer, the term of this patent is extended or adjusted under 35 U.S.C. 154(b) by 349 days.

(21) Appl. No.: 14/386,108

(22) PCT Filed: Apr. 11, 2013

(86) PCT No.: PCT/US2013/036256
§ 371 (c)(1),
(2) Date: Sep. 18, 2014

(87) PCT Pub. No.: WO2013/155356
PCT Pub. Date: Oct. 17, 2013

(65) Prior Publication Data
US 2015/0048840 A1    Feb. 19, 2015

Related U.S. Application Data

(60) Provisional application No. 61/623,478, filed on Apr. 12, 2012.

(51) Int. Cl.
*G01R 31/02* (2006.01)
*H02H 5/10* (2006.01)
*H02H 3/16* (2006.01)

(52) U.S. Cl.
CPC ......... *G01R 31/025* (2013.01); *H02H 5/105* (2013.01); *H02H 3/16* (2013.01)

(58) Field of Classification Search
CPC ......... G01R 31/025; H02H 5/105; H02H 3/16
USPC .......................................... 324/509, 539–544
See application file for complete search history.

(56) References Cited

U.S. PATENT DOCUMENTS

| | | | |
|---|---|---|---|
| 4,347,540 A | 8/1982 | Gary et al. | |
| 4,551,811 A * | 11/1985 | Taniguti | G01R 31/025 324/510 |
| 4,642,554 A | 2/1987 | Aucoin | |
| 4,897,606 A | 1/1990 | Cook et al. | |

(Continued)

FOREIGN PATENT DOCUMENTS

GB    2342455 A    12/2000

OTHER PUBLICATIONS

Al-Hajri, "Neutral Ground Resistor Monitoring Schemes "Conference Record of the 2004 IEEE International Symposium on Electrical Insulation, Sep. 19-22, 2004, pp. 388-393.*

*Primary Examiner* — Melissa Koval
*Assistant Examiner* — Courtney McDonnough

(57) ABSTRACT

A device for monitoring a neutral grounding resistor (NGR), including first and second NGRs electrically connected in parallel, a rectifier circuit electrically connected in series with the second NGR and a voltage source and a logic resistor electrically connected in series with the second NGR. A logic circuit measures current passing through the logic resistor and determines the resistance of the first NGR based on the measured current and the resistance of the second NGR. As such, a failed-open or failed-short condition of the first NGR may be identified based at least in part on the determined resistance of the first NGR.

15 Claims, 2 Drawing Sheets

(56) References Cited

U.S. PATENT DOCUMENTS 6,552,885 B1     4/2003   Campbell et al.
2005/0286186 A1   12/2005   Chang et al.

* cited by examiner

NEUTRAL GROUNDING RESISTOR MONITOR

BACKGROUND OF THE INVENTION

Field of the Invention

Embodiments of the present disclosure generally relate to an apparatus for connecting a neutral conductor of an electric circuit to ground through a neutral grounding component, and for monitoring the neutral grounding component. More particularly, the present disclosure relates to an improved apparatus that is operative to detect open states and shorted states in the neutral grounding component.

Discussion of Related Art

A wide variety of electric circuits comprise neutral conductors, which carry current in normal operation but are connected to ground. Connection to ground is desirable in order to prevent the accumulation of dangerous transient voltages between neutral and ground that can be hazardous to operators of equipment housing the circuitry. However, connecting neutral conductors to ground without intervening resistance may allow excessive current flow between neutral and ground, which can cause damage to circuit components. Therefore, some system connect the neutral conductor to ground across a neutral grounding resistor (NGR), the resistance of which is selected in order to limit ground current to safe levels in the event of a ground fault.

An NGR may fail in at least two ways. The NGR may enter a failed-open condition, in which the connection between neutral and ground is broken. Alternatively, the NGR may enter a failed-short condition, in which the NGR provides no resistance, and thus the neutral conductor may be shorted to ground. As noted above, it may be undesirable to have no connection between neutral and ground, and may also be undesirable to connect neutral to ground without an intervening resistance. As such, it may be desirable to monitor an NGR, in order to detect the occurrence of failed-open conditions and failed-short conditions. However, typical systems are not capable of reliably detecting failed short conditions in NGRs. Accordingly, there is a need for a neutral grounding solution that can be monitored to detect both failed-open and failed-short conditions.

SUMMARY OF THE INVENTION

Accordingly, there is a need for an NGR monitoring device that may identify both failed-open and failed-short conditions. Exemplary embodiments of the present disclosure are directed towards apparatuses for monitoring an NGR. For example, some embodiments describe an apparatus comprising a first neutral grounding resistor (NGR) and a second NGR electrically connected to a neutral conductor, a rectifier circuit electrically connected to the second NGR, a voltage source electrically connected to a logic resistor and the second NGR, and a logic circuit, the logic circuit operatively enabled to measure the current passing through the logic resistor. The logic circuit may determine the resistance of the first NGR based at least in part on the measured current and the resistance of the second NGR. Additionally, the logic circuit may identify a failed-short and/or a failed-open condition with the first NGR based at least in part on the measured current and the determined resistance of the first NGR.

DESCRIPTION OF EMBODIMENTS

Figure 1:
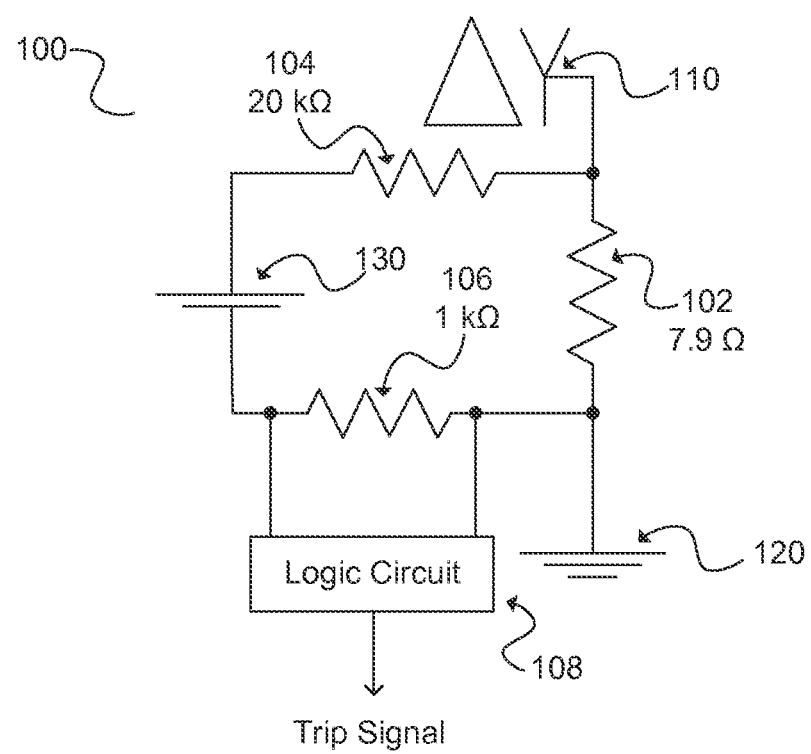
FIG. 1 illustrates a conventional apparatus to monitor an NGR.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

FIG. 1 illustrates a conventional apparatus 100 for monitoring an NGR. As depicted, the apparatus 100 includes an NGR 102 and circuitry for monitoring the NGR 102. A neutral conductor 110 is connected to ground 120 across NGR 102. A voltage source 130 is connected in series with a sensing resistor 104, NGR 102 and a logic resistor 106. Under normal operation, current supplied by voltage source 130 passes through sensing resistor 104, NGR 102, and logic resistor 106. Logic circuit 108 measures the current passing through logic resistor 106, and computes the resistance of NGR 102 based on this measurement and upon the known resistances of sensing resistor 104 and logic resistor 106. A failed-open condition may correspond to NGR 102 becoming the substantial equivalent of an open switch. As such, NGR 102 would pass substantially no current, and thus current also would not substantially pass through logic resistor 106. In such a scenario, logic circuit 108 may compute an extremely large or infinite resistance value of NGR 102 based on this substantially zero current, and may detect the failed-open condition on this basis.

Conversely, a failed-short condition may correspond to NGR 102 becoming the substantial equivalent of a closed switch. As such, the resistance of sensing resistor 104 and logic resistor 106 substantially determines the current passing through sensing resistor 104, NGR 102, and logic resistor 106. However, the resolution of the detection capabilities of logic circuit 108 may be too coarse to detect current differentials below a certain threshold, and the current differential caused by the failed-short condition may not exceed this threshold. For example, logic circuit 108 may only be able to detect current differentials of 2.5% or greater. As such, in some instances (e.g., when a failed-short condition does not cause the current to increase above 2.5% of normal) the logic circuit 108 may not be able to differentiate between normal operation and a failed-short condition.

As a particularly illustrative example, FIG. 1 depicts the resistance of NGR 102 as 7.9Ω, which is relatively small compared to those of sensing resistor 104 (i.e., 20 kΩ) and logic resistor 106 (i.e., 1 kΩ), and thus the current that passes through logic resistor 106 during a failed-short condition is only slightly higher than it would be under normal operation. Since the resistance of sensing resistor 104 is 20 kΩ, a 2.5% change in current would correspond to a change in resistance of at least 500Ω. Under such circumstances, since NGR 102 has a resistance of only 7.9Ω, logic circuit 106 may be unable to differentiate between normal operation and a failed-short condition, and thus may not detect a failed-short condition of NGR 102.

Figure 2:
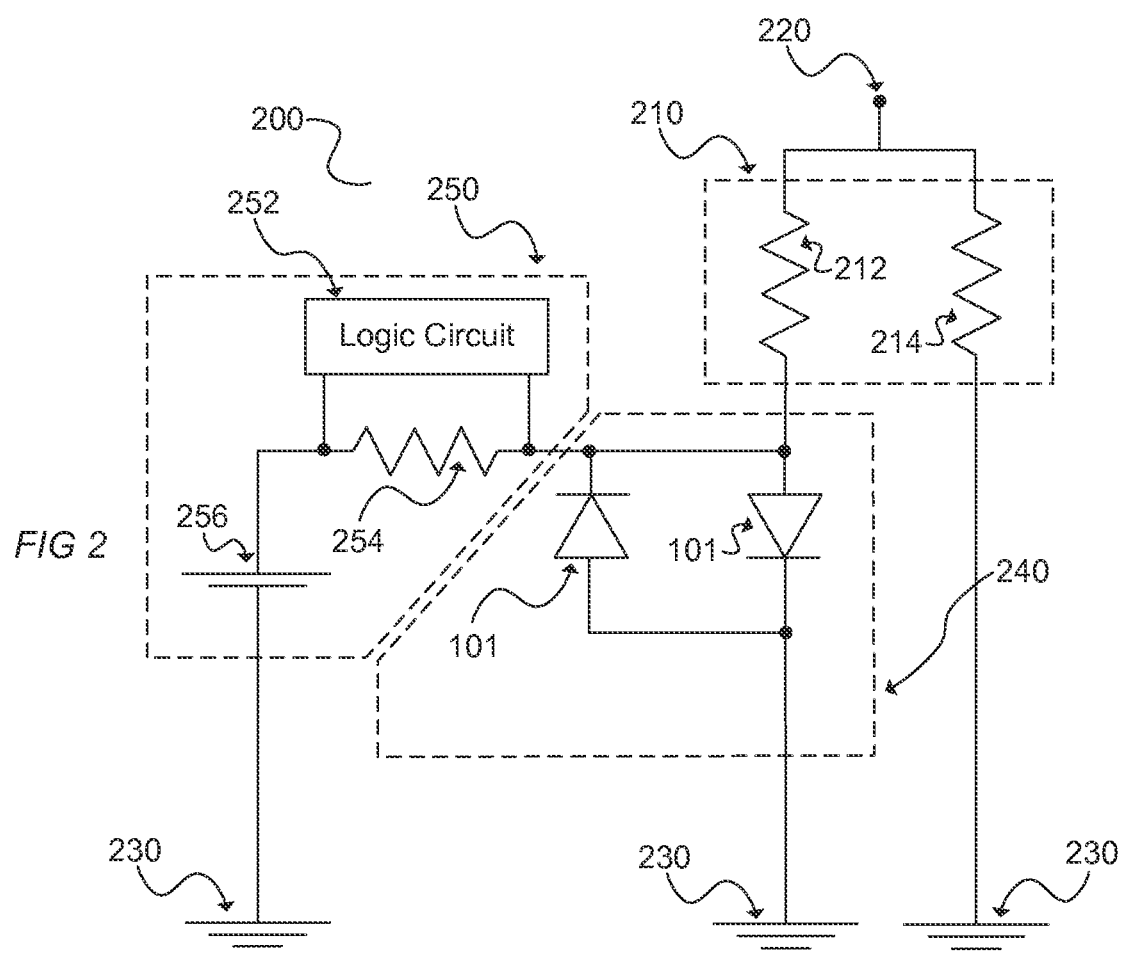
FIG. 2 illustrates an apparatus to monitor an NGR based on at least some embodiments of the present disclosure.

FIG. 2 illustrates an apparatus 200 to monitor an NGR based on at least some embodiments of the present disclosure. The apparatus 200 comprises a neutral grounding component 210 and circuitry for monitoring the neutral grounding component 210. Neutral grounding component 210 comprises parallel NGRs 212 and 214. A neutral conductor 220 is connected to ground 230 across NGR 214. A rectifier circuit 240 comprising rectifiers 242 and 244 (e.g., diodes, or the like) is coupled to NGR 212 and to ground 230. A monitoring circuit 250 comprising logic circuit 252, a logic resistor 254, and a voltage source 256 coupled to rectifier circuit 240 and to ground 230. Rectifier circuit 240 is operative to clamp the voltage during a ground fault, such that current is shared between NGR 212 and NGR 214. The voltage clamping provided by rectifier circuit 240 may also provide protection for the components of monitoring circuit 250 from damage caused by ground faults.

Under normal operation, current supplied by voltage source 256 (or power supply circuit) passes through logic resistor 254, NGR 212 and NGR 214. Logic circuit 252 measures the current passing through logic resistor 254, and computes the resistance of NGR 214 based on this measurement and upon the known resistances of NGR 212 and logic resistor 254. A failed-open condition may correspond to NGR 214 becoming the substantial equivalent of an open switch. As such, NGR 214 would pass substantially no current, and thus current also would not substantially pass through logic resistor 254. Logic circuit 252 may compute an extremely large or infinite resistance value of NGR 214 based on this substantially zero current, and detect the failed-open condition on this basis. A failed-short condition may correspond to NGR 214 becoming the substantial equivalent of a closed switch. As such, the resistance of NGR 212 and logic resistor 254 substantially determines the current passing through logic resistor 254, NGR 212 and NGR 214. In some examples, the resistance of NGR 212 may be equal to that of NGR 214, and greater than that of logic resistor 254, and thus the current that passes through logic resistor 254 during a failed-short condition may be substantially higher than it would be under normal operation. Since the current passing through logic resistor 254 may be substantially higher, the current differential may be above the threshold of logic circuit 252.

For example, in one embodiment, the resistances of NGR 212 and NGR 214 may each be 960Ω, the resistance of logic resistor 254 may be 1Ω, and a 2.5% current differential threshold of logic circuit 252 may correspond to a change in resistance of 2.5% of 960Ω, or 24Ω. Under such circumstances, since NGR 214 has a resistance of 960Ω, logic circuit 252 may be able to differentiate between normal operation and failed-short conditions, as well as between normal operation and failed-open conditions. As such, logic circuit 252 may be able to detect both failed-open and failed short conditions.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:
1. An apparatus comprising:
a neutral grounding component comprising a first neutral grounding resistor and a second neutral grounding resistor; a neutral conductor connected to ground across the second neutral grounding resistor;
a rectifier circuit comprising a first rectifier and a second rectifier, the rectifier circuit coupled to the first neutral grounding resistor and to ground; and
a monitoring circuit comprising a logic circuit, a monitoring circuit resistor, and a voltage source, the monitoring circuit coupled to the rectifier circuit and to ground;
wherein the logic circuit measures current passing through the monitoring circuit resistor and computes a resistance value of the second neutral grounding resistor based on the measurement of the current passing through the monitoring circuit resistor and known resistance values of the first neutral grounding resistor and the monitoring circuit resistor, wherein the logic circuit determines a failed upon condition of the second neutral grounding resistor or a failed-short condition of the second neutral grounding resistor based on the computed resistance value of the second neutral grounding resistor and the measurement of the current passing through the monitoring circuit resistor.

2. The apparatus of claim 1, wherein under normal operation, current supplied by the voltage source passes through the monitoring circuit resistor, the first neutral grounding resistor, and the second neutral grounding resistor.

3. The apparatus of claim 1, wherein the logic circuit determines a failed-open condition of the second neutral grounding resistor based on computing a relatively large or infinite resistance value of the second neutral grounding resistor.

4. The apparatus of claim 3, wherein the measured current passing through the monitoring circuit resistor is substantially zero for a failed-open condition of the second neutral grounding resistor.

5. The apparatus of claim 1, wherein the logic circuit determines a failed-short condition of the second neutral grounding resistor based on the measurement of the current passing through the monitoring circuit resistor being above a threshold of the logic circuit.

6. The apparatus of claim 5, wherein the resistance value of the second neutral grounding resistor corresponds to a substantial equivalent of a closed switch during a failed-short condition.

7. The apparatus of claim 1, wherein the logic circuit is coupled in parallel across the monitoring circuit resistor.

8. The apparatus of claim 7, wherein the logic circuit and the monitoring circuit resistor are coupled to the first rectifier and the second rectifier.

9. The apparatus of claim 8, wherein the first rectifier and the second rectifier are coupled to the first neutral grounding resistor.

10. The apparatus of claim 1, wherein the first rectifier and the second rectifier are each diodes.

11. The apparatus of claim 10, wherein the anode of the first rectifier diode is electrically connected to the cathode of the second rectifier diode and the cathode of the first rectifier diode is electrically connected to the anode of the second rectifier diode.

12. The apparatus of claim 1, wherein the first neutral grounding resistor and the second neutral grounding resistor have substantially the same resistance.

13. The apparatus of claim 1, wherein the monitoring circuit resistor has substantially less resistance than either the first neutral grounding resistor or the second neutral grounding resistor.

14. A method for monitoring a first neutral grounding resistor comprising:

measuring current flowing through a monitoring circuit resistor, wherein the monitoring circuit resistor is electrically connected in series with a voltage source and a second neutral grounding resistor, the second neutral grounding resistor being electrically connected in parallel with the first neutral grounding resistor, the second neutral grounding resistor being electrically connected in series with a rectifier circuit, the rectifier circuit being electrically connected in parallel with the voltage source and the monitoring circuit resistor;

determining a resistance of the first neutral grounding resistor based on the measured current and a known resistance of the second neutral grounding resistor and the monitoring circuit resistor; and determining whether the first neutral grounding resistor has experienced a failed-open or a failed-short condition based on the determined resistance of the first neutral grounding resistor and the measured current flowing through a monitoring circuit resistor.

15. The method of claim 14, wherein an increase of the measured current flowing through the monitoring circuit resistor above a threshold identifies a failed-short condition of the first neutral grounding resistor and a relatively larger or infinite determined resistance of the first neutral grounding resistor identifies a failed-open condition of the first neutral grounding resistor.

\* \* \* \* \*